(12) United States Patent
Minotani et al.

(10) Patent No.: US 12,308,868 B2
(45) Date of Patent: May 20, 2025

(54) AMPLIFIER CIRCUIT

(71) Applicants: Nippon Telegraph and Telephone Corporation, Tokyo (JP); NTT Innovative Devices Corporation, Yokohama (JP)

(72) Inventors: Tadashi Minotani, Tokyo (JP); Toshiki Kishi, Tokyo (JP); Masatoshi Tobayashi, Yokohama (JP); Yoshikazu Urabe, Yokohama (JP)

(73) Assignees: NIPPON TELEGRAPH AND TELEPHONE CORPORATION, Tokyo (JP); NTT INNOVATIVE DEVICES CORPORATION, Yokohama (JP)

( * ) Notice: Subject to any disclaimer, the term of this patent is extended or adjusted under 35 U.S.C. 154(b) by 70 days.

(21) Appl. No.: 18/550,781

(22) PCT Filed: Mar. 25, 2022

(86) PCT No.: PCT/JP2022/014546
§ 371 (c)(1),
(2) Date: Sep. 15, 2023

(87) PCT Pub. No.: WO2022/203059
PCT Pub. Date: Sep. 29, 2022

(65) Prior Publication Data
US 2024/0154634 A1  May 9, 2024

(30) Foreign Application Priority Data
Mar. 25, 2021  (JP) .................. 2021-051321

(51) Int. Cl.
*H04B 1/04* (2006.01)
*H03F 3/19* (2006.01)

(52) U.S. Cl.
CPC ................. *H04B 1/04* (2013.01); *H03F 3/19* (2013.01)

(58) Field of Classification Search
CPC ........ H03F 1/0266; H03F 3/68; H03F 1/0272; H03F 3/19; H03F 2200/451; H04B 1/16; H04B 1/04; H04L 25/06; H04L 25/03
See application file for complete search history.

(56) References Cited

U.S. PATENT DOCUMENTS

| 2005/0067698 | A1 | 3/2005 | Aruga et al. |
| 2015/0155832 | A1* | 6/2015 | Onizuka ................. H04L 25/03 330/251 |

(Continued)

FOREIGN PATENT DOCUMENTS

| JP | S57112089 A | 7/1982 |
| JP | 2004047832 A | 2/2004 |
| WO | 2018074410 A1 | 4/2018 |

OTHER PUBLICATIONS

Atsushi Takai, "Optical transmission technology that supports data centers—Hyperscale data center edition" https://eetimes.jp/ee/articles/1809/20/news011_4.html, Sep. 20, 2018, 5 pages. As discussed in the specification.

*Primary Examiner* — Aristocratis Fotakis
(74) *Attorney, Agent, or Firm* — Slater Matsil, LLP (57) ABSTRACT

An amplifier circuit includes: an amplifier connected to an isolating element; a signal midpoint detecting circuit connected in parallel with the isolating element; a bias adding circuit connected in series with the signal midpoint detecting circuit; and an initial voltage value detecting circuit connected to the frame detecting circuit. The initial voltage value detecting circuit holds an initial voltage value of the baseband signal using a signal from the frame detecting circuit, and outputs the initial voltage value to the signal midpoint detecting circuit. The signal midpoint detecting (Continued)

circuit detects a midpoint voltage from the baseband signal and the initial voltage value, and outputs the midpoint voltage to the bias adding circuit. The bias adding circuit adds the midpoint voltage to a bias voltage for biasing the baseband signal. The amplifier amplifies the baseband signal.

8 Claims, 7 Drawing Sheets

(56) References Cited

U.S. PATENT DOCUMENTS

| | | | |
|---|---|---|---|
| 2016/0360571 A1* | 12/2016 | Yokosawa | H04W 88/085 |
| 2017/0195972 A1* | 7/2017 | Drogi | H03F 3/191 |
| 2019/0245624 A1 | 8/2019 | Kishi et al. | |
| 2020/0228063 A1* | 7/2020 | Khlat | H03F 1/0227 |
| 2021/0314870 A1* | 10/2021 | Hoversten | H04W 52/0261 |

* cited by examiner

FIG.9

AMPLIFIER CIRCUIT

CROSS-REFERENCE TO RELATED APPLICATIONS

This patent application is a national phase entry of PCT Application No. PCT/JP2022/014546, filed on Mar. 25, 2022, which claims priority to Japanese Patent Application No. 2021-051321, filed on Mar. 25, 2021. Both of the aforementioned applications are hereby incorporated by reference in their entireties.

TECHNICAL FIELD

The present invention relates to an amplifier circuit for amplifying baseband signals.

BACKGROUND

Unipolar codes such as NRZ and PAM4 are used in communication systems using electrical and optical signals. Such a communication system is characterized by a simple configuration of the transceiver circuit and low delay. In addition, in such a communication system, signal processing of signal amplification is executed at the receiving side for both the electrical and optical signals. The signal amplitude decreases when signals in a communication channel are attenuated significantly, and therefore it is necessary to increase the gain of the signal amplification. The reception circuit is therefore configured by connecting the amplifier circuits in series.

When the output and input of each amplifier circuit connected in series are connected by DC coupling, there is a disadvantage in that the output range is narrowed if the overall gain is large since offset errors in the amplifier in the first stage are amplified also. Thus, generally, the output and input of each amplifier are connected by AC coupling.

CITATION LIST

Non Patent Literature

Non-Patent Literature 1 https://ednjapan.com/edn/articles/1805/11/news018_4.html

SUMMARY

Technical Problem

As described above, when amplifying baseband signals containing DC components by AC coupling, a transient phenomenon occurs in the AC coupling. As a result, DC components are included in signals immediately after the frame input, whereas DC components are removed in signals after elapsing time after the frame input. When such an amplifier circuit is used for Ethernet, a preamble is provided at the head of the frame and signals immediately after the frame input and that contain DC components are not used, and thus losing signals at the head is allowed.

However, in methods such as 64B/66B or 128B/130B coding described in Non-patent literature 1 in which losing bits at the head is not allowed, it is necessary to transmit a frame from the head to the end including the DC components. In particular, in a communication scheme where high density and low power consumption are required, the problem that DC components are removed in the signals in the amplifier circuit described above becomes significant when a single-end transmission technique is used without using differential signals capable of removing the common mode and amplifying only differential components.

Figure 9:
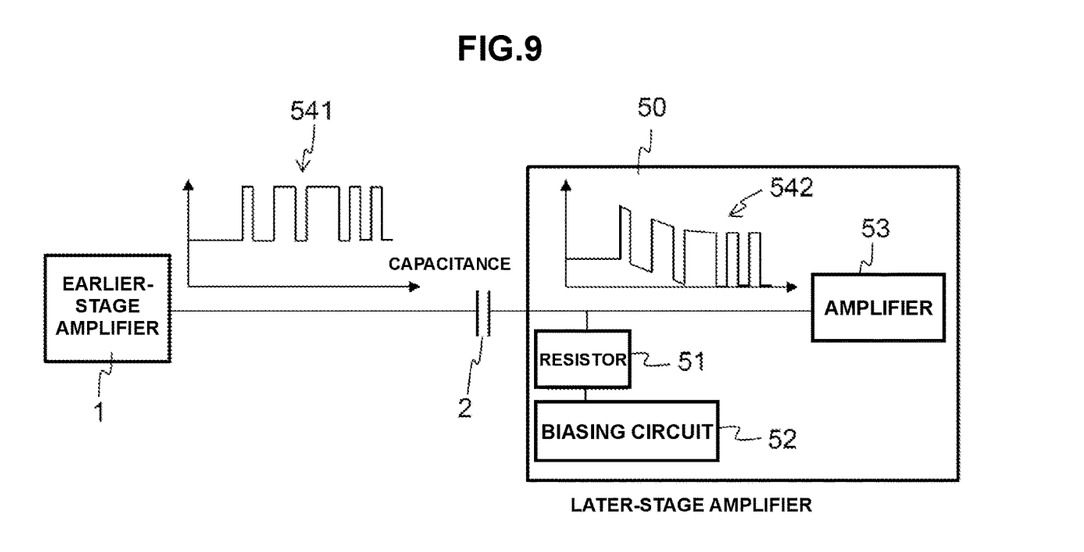
FIG. 9 shows a block diagram illustrating a connection configuration of a conventional amplifier circuit.

As shown in FIG. 9, in a conventional AC coupled amplifier circuit, an amplifying unit 53 of a later-stage amplifier 50 is biased with a predetermined bias voltage and is isolated from a preceding stage amplifier 1 by a capacitance 2 such that the bias voltage does not change by the DC current flowing into the later-stage amplifier 50 in the connection with the preceding stage amplifier 1.

When baseband signals are transmitted from the preceding stage amplifier 1 to the later-stage amplifier 50, the DC components contained in the baseband signals due to the effect of the capacitor 2 are gradually attenuated in accordance with a CR time constant of the capacitor 2 and the resistor 51. Meanwhile, when the bias voltage of the amplifying unit 53 is amplified in accordance with the data signals immediately after the data input, the data after the DC components are attenuated in accordance with the CR time constant is not transmitted accurately. Meanwhile, when the bias voltage is amplified in accordance with the data signals after the DC components are attenuated in accordance with the CR time constant, the data immediately after the data input is not transmitted accurately. Thus, there is a problem in the conventional AC coupled amplifier circuit that signals in baseband signals cannot be transmitted accurately.

An object of embodiments of the present invention is to provide an amplifier circuit that can accurately transmit baseband signals including DC components by connecting a preceding stage amplifier and a later-stage amplifier by AC coupling in order to remove the offset voltage of the preceding stage amplifier.

Solution to Problem

In order to solve the above-described problems, an amplifier circuit according to embodiments of the present invention is an amplifier circuit for amplifying baseband signals input from an amplifier circuit in a preceding stage, the amplifier circuit comprising: an isolating element connected to an input terminal; an amplifying unit connected between the isolating element and an output terminal; a signal midpoint detecting unit connected in parallel to the isolating element; a bias adding unit connected to the signal midpoint detecting unit in series, an initial voltage value detecting circuit connected to a frame detecting circuit, wherein the initial voltage value detecting circuit, in accordance with a signal of the frame detecting circuit, holds an initial voltage value of the baseband signals and outputs the initial voltage value to the signal midpoint detecting unit; the signal midpoint detecting unit detects a midpoint voltage from the baseband signals and the initial voltage value, and outputs the midpoint voltage to the bias adding unit; the bias adding unit adds the midpoint voltage to a bias voltage for biasing the baseband signals; and the amplifying unit amplifies the baseband signals.

In addition, an amplifier circuit according to embodiments of the present invention is an amplifier circuit for amplifying a plurality of baseband signals input from a plurality of amplifier circuits in a preceding stage, the amplifier circuit comprising: a plurality of isolating elements each connected to corresponding one of a plurality of input terminals; a plurality of amplifying units each connected between corresponding one of the plurality of isolating elements and corresponding one of a plurality of output terminals; a plurality of signal midpoint detecting units each connected in parallel to corresponding one of the plurality of isolating elements; a plurality of bias adding units each connected in series with corresponding one of the plurality of signal midpoint detecting units; and an inter-channel interpolating VL detecting circuit, wherein the inter-channel interpolating VL detecting circuit detects a low voltage signal among the plurality of baseband signals and outputs the low voltage signal to the corresponding one of the plurality of signal midpoint detecting units; the signal midpoint detecting unit detects a midpoint voltage from the baseband signals and the low voltage signal and outputs the midpoint voltage to the bias adding unit; the bias adding unit adds the midpoint voltage to a bias voltage for biasing the baseband signals; and the amplifying unit amplifies the baseband signals.

An amplifier circuit according to embodiments of the present invention is a connection circuit connected to preceding stages in a plurality of transmitter circuits and to which a plurality of baseband signals are input, the connection circuit comprising: a plurality of isolating elements each connected between corresponding one of a plurality of input terminals and corresponding one of a plurality of output terminals; a plurality of amplifying units each connected between corresponding one of the plurality of isolating elements and the corresponding one of the plurality of output terminals; a plurality of frame detecting circuits each connected in parallel to the corresponding one of the plurality of isolating elements; a plurality of switching devices each connected in series with corresponding one of the plurality of frame detecting circuits; a plurality of bias adding units each connected in series with corresponding one of the plurality of switching devices; and a differential mean midpoint voltage calculating unit to which an output of an inter-channel interpolating VL detecting circuit and an output of an inter-channel interpolating VH detecting circuit are input, wherein the inter-channel interpolating VL detecting circuit detects an input of a low voltage signal in a plurality of baseband signals and outputs the low voltage signal to the differential mean midpoint voltage calculating unit; the inter-channel interpolating VH detecting circuit detects an input of a high voltage signal in a plurality of baseband signals and outputs the high voltage signal to the differential mean midpoint voltage calculating unit; the differential mean midpoint voltage calculating unit outputs a midpoint voltage to the switching device from an output of the inter-channel interpolating VL detecting circuit and an output of the inter-channel interpolating VH detecting circuit; the switching device outputs the midpoint voltage to the bias adding unit in accordance with an input from the frame detecting circuit; the bias adding unit adds the midpoint voltage to a bias voltage for biasing the baseband signals; and the amplifying unit amplifies the baseband signals.

Advantageous Effects of Embodiments of Invention

In accordance with embodiments of the present invention, it is possible to provide an amplifier circuit that can amplify and accurately transmit baseband signals including DC components.

DETAILED DESCRIPTION OF ILLUSTRATIVE EMBODIMENTS

First Embodiment

The amplifier circuit according to the first embodiment of the present invention will be described with reference to FIGS. 1-3.

Configuration of the Amplifier Circuit

Figure 1:
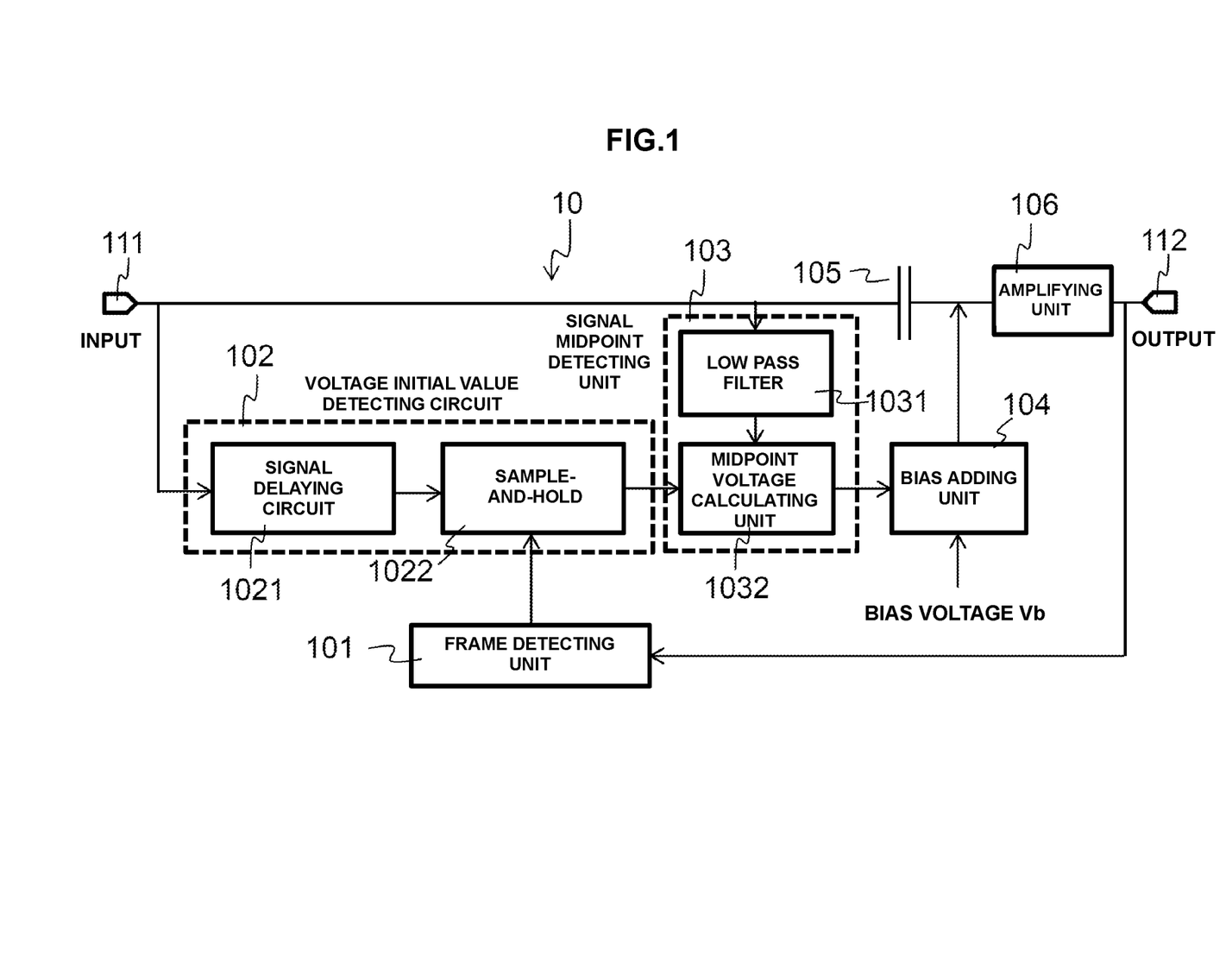
FIG. 1 shows a block diagram illustrating a configuration of an amplifier circuit according to a first embodiment of the present invention.

The amplifier circuit 10 according to the present embodiment includes an initial voltage value detecting circuit 102, a frame detecting circuit 101, a signal midpoint detecting unit 103, a bias adding unit 104, an isolating element 105, and an amplifying unit 106 as shown in FIG. 1. A device such as a capacitor having a capacitive element (capacitance), or an optical coupler can be used for the isolating element 105.

The frame detecting circuit 101 detects changes in the voltage of the baseband signals (hereinafter referred to as the "data signal") supplied from the amplifying unit 106 and outputs the frame detection signal. The frame detecting circuit 101 can be constituted by a multi-vibrator circuit, an anti-chattering RS latch circuit, a low pass filter, or the like.

The initial voltage value detecting circuit 102 includes, in order from the input terminal in side, a signal delaying circuit 1021 and a sample-and-hold circuit 1022 to detect a voltage at the time when the data signal is not input yet (hereinafter referred to as the "initial voltage value"), hold the initial voltage value as a result of the input of the frame detection signal, and output the initial voltage value.

The signal midpoint detecting unit 103 includes, in order from the input terminal in side, a low pass filter 1031 and a midpoint voltage calculating unit 1032 to detect a midpoint voltage that is a voltage at a midpoint between a high voltage and a low voltage of the voltage of the data.

The bias adding unit 104 biases the baseband signals input to the amplifying unit 106 by adding the midpoint voltage when the data signal is input.

The isolating element 105 removes DC components including the offset of the signal input from a preceding stage amplifier (not shown).

The amplifying unit 106 amplifies the baseband signals biased by the bias adding unit 104.

In the amplifier circuit 10, a circuit constituted by the initial voltage value detecting circuit 102, the signal midpoint detecting unit 103, and the bias adding unit 104 is connected in parallel to the isolating element 105. In addition, the output of the frame detecting circuit 101 is input to the initial voltage value detecting circuit 102.

Here, the signal delaying circuit 1021 of the initial voltage value detecting circuit 102, and the low pass filter 1031 of the signal midpoint detecting unit 103 are connected in parallel to each other.

In the initial voltage value detecting circuit 102, the signal delaying circuit 1021 and the sample-and-hold circuit 1022 are connected in series with each other, and the output of the frame detecting circuit 101 is input (connected) to the sample-and-hold circuit 1022.

In the signal midpoint detecting unit 103, the low pass filter 1031 and the midpoint voltage calculating unit 1032 are connected in series with each other, and the output of the sample-and-hold circuit 1022 is input (connected) to the midpoint voltage calculating unit 1032.

The output of the midpoint voltage calculating unit 1032 of the signal midpoint detecting unit 103 is input (connected) to the bias adding unit 104. In the bias adding unit 104, the output of the midpoint voltage calculating unit 1032 is added to the bias voltage to be output to the amplifying unit 106.

Operation of the Amplifier Circuit

The operation of the amplifier circuit 10 according to the present embodiment will be described with reference to FIG. 2.

Before the data signal is input to the amplifier circuit 10, a low voltage VL is supplied from the preceding stage amplifier as the initial voltage value. Thereafter, when the signals are input, the waveform varies between a high voltage VH and a low voltage VL from the head of the data according to the data of the signals (121 in FIG. 2).

Figure 2:
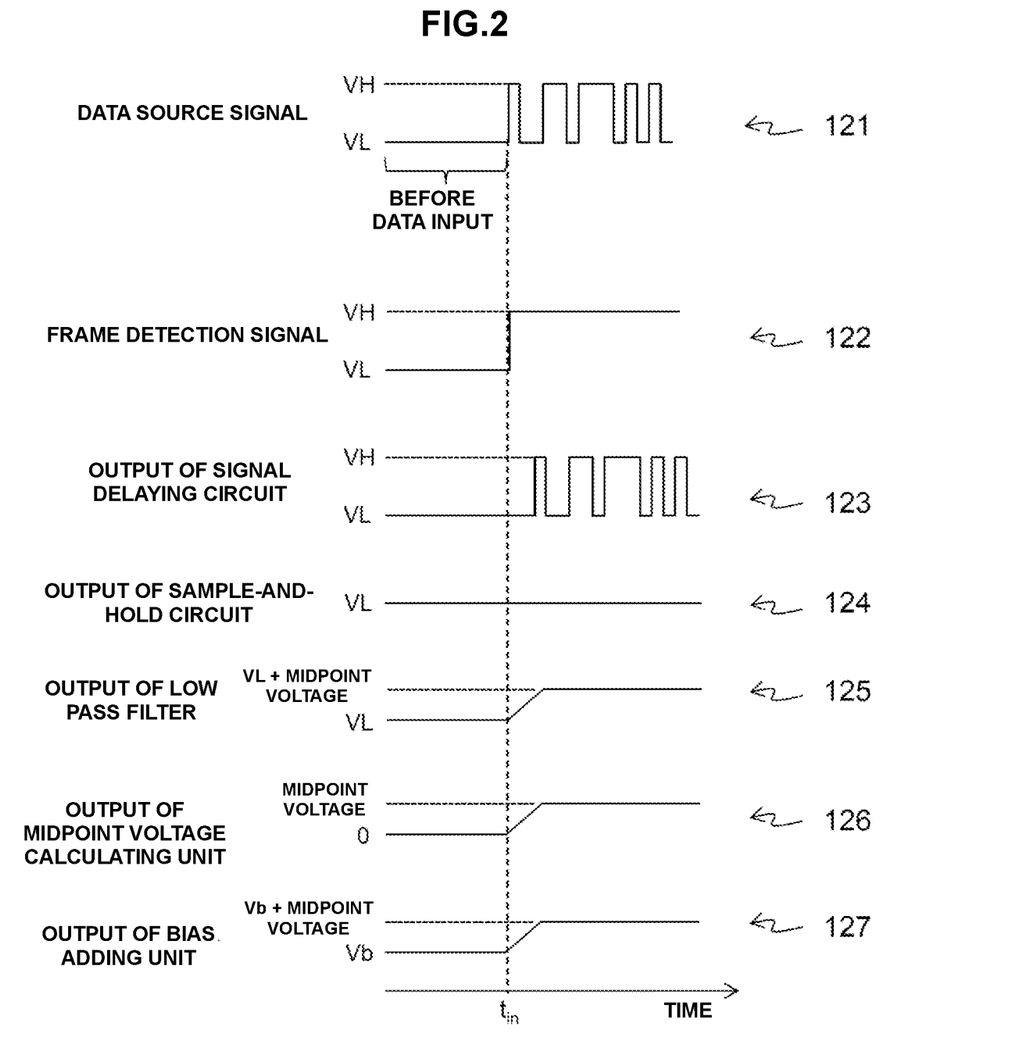
FIG. 2 shows a time chart illustrating an operation of the amplifier circuit according to the first embodiment of the present invention.
Figure 3:
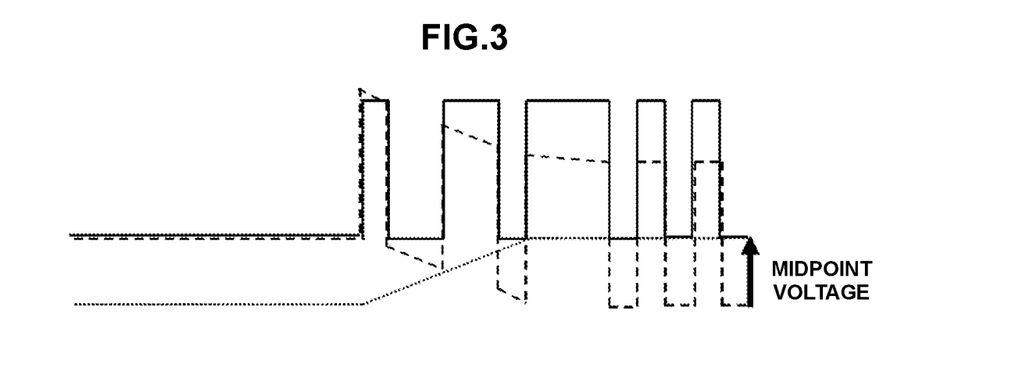
FIG. 3 shows a schematic signal diagram for illustrating the operation of the amplifier circuit according to the first embodiment of the present invention.

The frame detecting circuit 101 reads that the data signals amplified by the amplifying unit 106 change, outputs the frame detection signal at the high voltage VH, and once the frame detection signal is output at the high voltage VH, outputs the high voltage VH continuously (122 in FIG. 2). Thereafter, when a predetermined condition is met, such as when the low voltage VL continues for a predetermined period in the data signals, the output of the high voltage VH is stopped and the low voltage VL is output (not shown).

For example, when a multi-vibrator circuit is used for the frame detecting circuit 101, the multi-vibrator circuit outputs a rectangular wave (high voltage VH) having a predetermined time width as a result of the input of the data signals, continues the output for a predetermined period, and then outputs the low voltage VL.

For example, when an RS latch circuit is used for the frame detecting circuit 101, the high voltage VH is output, in a situation where the data signal is not input to one terminal (not shown) of the RS latch circuit, when the data signal is input (high voltage VH) to the other terminal. The output of high voltage VH is maintained even when the data signal input to said other terminal had become low voltage VL. Thereafter, the low voltage VL is output when an input is supplied to said one terminal (not shown).

For example, when a low pass filter is used in the frame detecting circuit 101, an input of the data signal having the high voltage VH causes the signal change to mitigate and planarize, and therefore the frame detection signals are output continuously. Meanwhile, when the data signals continues to output low voltage VL, the output of the signal to be planarized becomes the low voltage VL. Furthermore, by connecting a comparator circuit to the later stage of the low pass filter, the frame detection signal can be output at the high voltage VH when the output of the low pass filter is greater than or equal to a predetermined threshold, and the frame detection signal can be output at the low voltage VL when the output of the low pass filter continues to be below the predetermined threshold.

The data signals are delayed in the signal delaying circuit 1021 (123 in FIG. 2). As a result, when the frame detection signal is output, the output of the signal delaying circuit 1021 is still at the low voltage VL, which is an initial voltage value at the time before the data signal is input.

Signals delayed by the signal delaying circuit 1021 are input to the sample-and-hold circuit 1022. Meanwhile, the sample-and-hold circuit 1022 outputs the initial voltage value (low voltage VL) as is before the time when the data signal is input to the amplifier circuit 10 ($t_{in}$). Moreover, after the time when the data signal is input to the amplifier circuit 10 ($t_{in}$), the initial voltage value at the time before the data signal is input is supplied from the signal delaying circuit 1021 to the sample-and-hold circuit 1022 at the low voltage VL when the frame detection signal described above is input to the sample-and-hold circuit 1022. As a result, the initial voltage value (low voltage VL) is maintained after the input of the data signal to the amplifier circuit 10, to be output to the midpoint voltage calculating unit 1032 of the signal midpoint detecting unit 103 (124 in FIG. 2).

In the low pass filter 1031 of the signal midpoint detecting unit 103, the initial voltage value VL is output before the data is input, and the data-smoothed VL+midpoint voltage is output after the data is input (125 in FIG. 2). In the low pass filter 1031, high frequency components of the data signals are cut-off such that the data signals consist of low frequency components, and therefore the signal change is mitigated and planarized. As a result, (VL+midpoint voltage) is output, which is the sum of VL and a midpoint voltage, which is an average value of the signal change. Here, the output voltage increases from VL to (VL+midpoint voltage) according to the time constant inside the low pass filter 1031.

In the midpoint voltage calculating unit 1032, a conventional subtraction circuit is used to output a difference between the output of the low pass filter 1031 and the output of the sample-and-hold circuit. As a result, zero is output before the data is input and the midpoint voltage is output after the data is input (126 in FIG. 2).

In the bias adding unit 104, a conventional addition circuit is used to output the sum of the bias voltage Vb of the amplifying unit 106 and the output (midpoint voltage) of the midpoint voltage computation unit 1032 (127 in FIG. 2). As a result, the baseband signals input to the amplifying unit 106 are biased by Vb before the data is input and (Vb+midpoint voltage) after the data is input.

A transient phenomenon change occurs in DC components of the baseband signals output from the preceding stage amplifier in accordance with a CR time constant formed by an output resistor (not shown) of the isolating element 105 and the bias adding unit 104. In this change, attenuation of DC components is small at head portions of the baseband signals, and attenuation of DC components is large at tail portions of the baseband signals. The DC components of the baseband signals include such waveform distortion (dashed line in FIG. 3). When the baseband signals are biased by the output of the bias adding unit 104 (dashed line in FIG. 3), the waveform distortion in accordance with the CR time constant in DC components of the baseband signals is canceled by the change (increase) in accordance with the time constant inside the low pass filter 1031 for the output of the bias adding unit 104 (solid line in FIG. 3). As a result, the waveform distortion of the baseband signals input to the amplifying unit 106 is reduced.

In this manner, the amplifier circuit 10 according to the present embodiment can bias the baseband signals supplied from the preceding stage amplifier with a bias voltage, to which the midpoint voltage of the baseband signals is added, and therefore the baseband signals with reduced distortion can be input to the amplifying unit 106.

Accordingly, the amplifying unit 106 amplifies the distortion-reduced baseband signals, and therefore the baseband signals can be amplified accurately.

Thus, in accordance with the amplifier circuit according to the present embodiment, a preceding stage amplifier and a later-stage amplifier can be connected by AC coupling in order to remove the offset voltage of the preceding stage amplifier, and therefore the baseband signals containing DC components can be amplified accurately.

Second Embodiment

The amplifier circuit according to the second embodiment of the present invention will be described with reference to FIG. 4.

Configuration of the Amplifier Circuit

Figure 4:
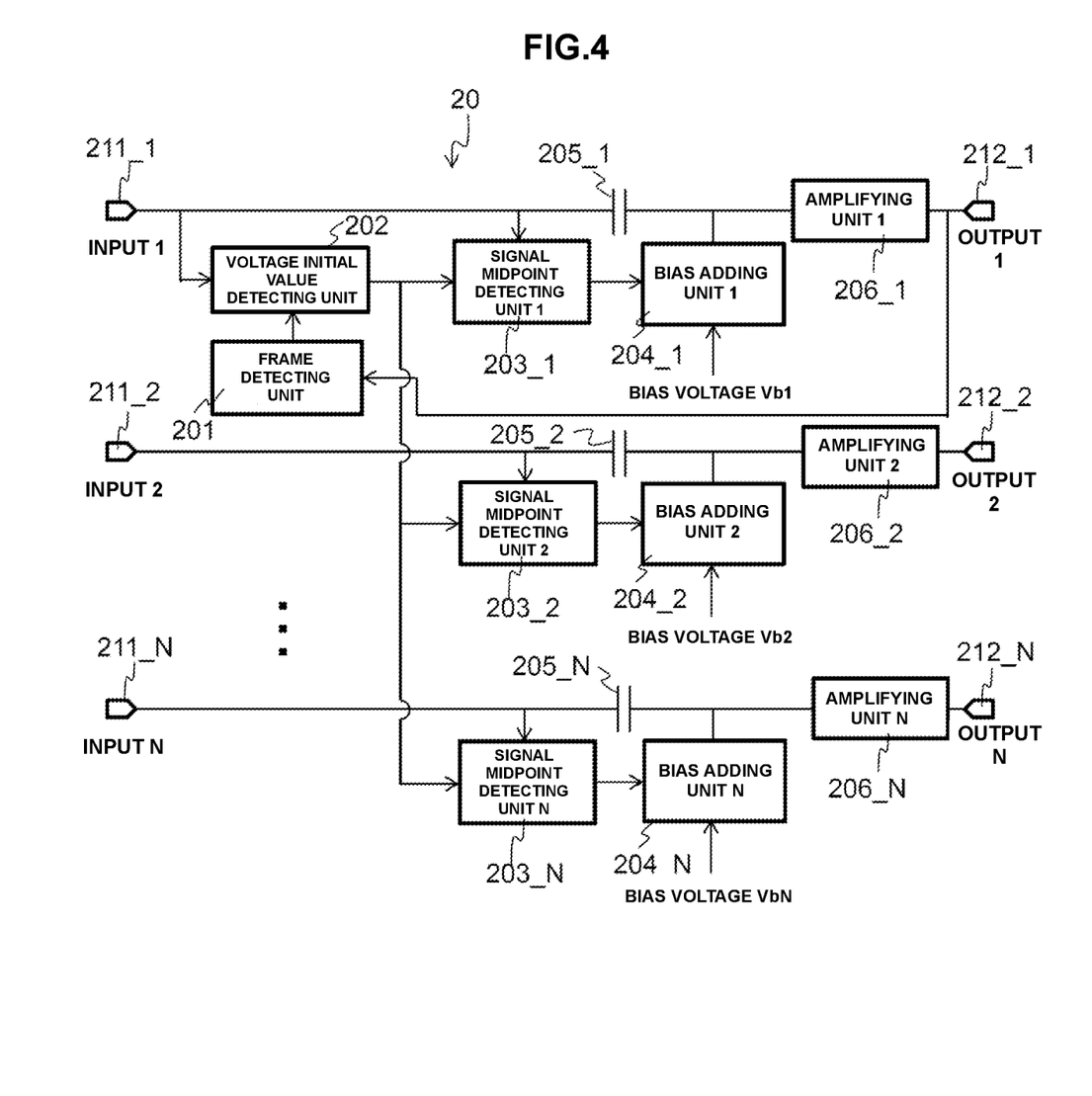
FIG. 4 shows a block diagram illustrating a configuration of an amplifier circuit according to a second embodiment of the present invention.

As illustrated in FIG. 4, the amplifier circuit 20 according to the present embodiment includes, for a plurality (N) of inputs and outputs, one initial voltage value detecting circuit 202, one frame detecting circuit 201, a plurality (N) of signal midpoint detecting units 203_1 to 203_N, a plurality (N) of bias adding units 204_1 to 204_N, a plurality (N) of isolating elements 205_1 to 205_N, and amplifying units 206_1 to 206_N. The configurations of the initial voltage value detecting circuit 202 and the signal midpoint detecting unit 203_1 to 203_N and the connecting mode between the initial voltage value detecting circuit 202 and the frame detecting circuit 201 are the same as the first embodiment.

In the amplifier circuit 20, the signal midpoint detecting units 203_1 to 203_N and the bias adding units 204_1 to 204_N are connected in series, respectively, in parallel to the plurality of isolating elements 205_1 to 205_N, and the output of the initial voltage value detecting circuit 202 connected to one of the plurality of input terminals (e.g., input terminal 211_1) is input (connected) to midpoint voltage calculating units of the plurality of signal midpoint detecting units 203_1 to 203_N.

Operation of the Amplifier Circuit

Similarly to the first embodiment, the initial voltage value detecting circuit 202 outputs the initial voltage value VL regardless of the input of the data signal. Meanwhile, in the amplifier circuit 20 according to the present embodiment, the initial voltage value VL is output to the midpoint voltage calculating units of the plurality of signal midpoint detecting units 203_1 to 203_N regardless of the input of the data signal.

If the specifications of electrical signals are the same in all inputs (1 to N) in the connection circuit 20, an initial voltage value detecting circuit 202 connected to one input terminal (e.g., the input terminal 211_1) can output the same initial voltage value VL for all the signal midpoint detecting units 203_1 to 203_N.

As a result, as in the first embodiment, the difference between the output of the low pass filter and the output of the initial voltage value detecting circuit 202 (initial voltage value VL) is output by the corresponding midpoint voltage calculating unit of the signal midpoint detecting units 203_1 to 203_N, and the base band signals input to the transmission circuit are biased by the bias adding units 204_1 to 204_N, and therefore the waveform distortion of the baseband signals is reduced.

In this manner, the amplifier circuit 20 according to the present embodiment can bias the baseband signals supplied from a plurality of preceding stage amplifiers with a bias voltage, to which the midpoint voltage of the baseband signals is added, and therefore the baseband signals with reduced distortion can be input to the plurality of amplifying units 206_1 to 206_N, respectively.

Accordingly, the amplifying units 206_1 to 206_N amplify the baseband signals with reduced distortion and thus can accurately amplify the baseband signals.

Thus, in accordance with the amplifier circuit according to the present embodiment, a preceding stage amplifier and a later-stage amplifier can be connected by AC coupling in order to remove the offset voltage of the preceding stage amplifier, and therefore the baseband signals containing DC components can be amplified accurately.

Furthermore, in accordance with the amplifier circuit 20 according to the present embodiment, only one initial voltage value detecting circuit and one frame circuit are arranged as compared to the configuration in which the initial voltage value detecting circuits and the frame detecting circuits are arranged for all inputs, and thus it is possible to reduce power consumption and chip area.

Third Embodiment

The amplifier circuit according to the third embodiment of the present invention will be described with reference to FIGS. 5 to 6. The amplifier circuit according to the present embodiment is different from the amplifier circuit according to the second embodiment in the configuration of a preceding stage of the signal midpoint detecting unit. Other configurations are similar to those of the second embodiment.

Configuration of the Amplifier Circuit

Figure 5:
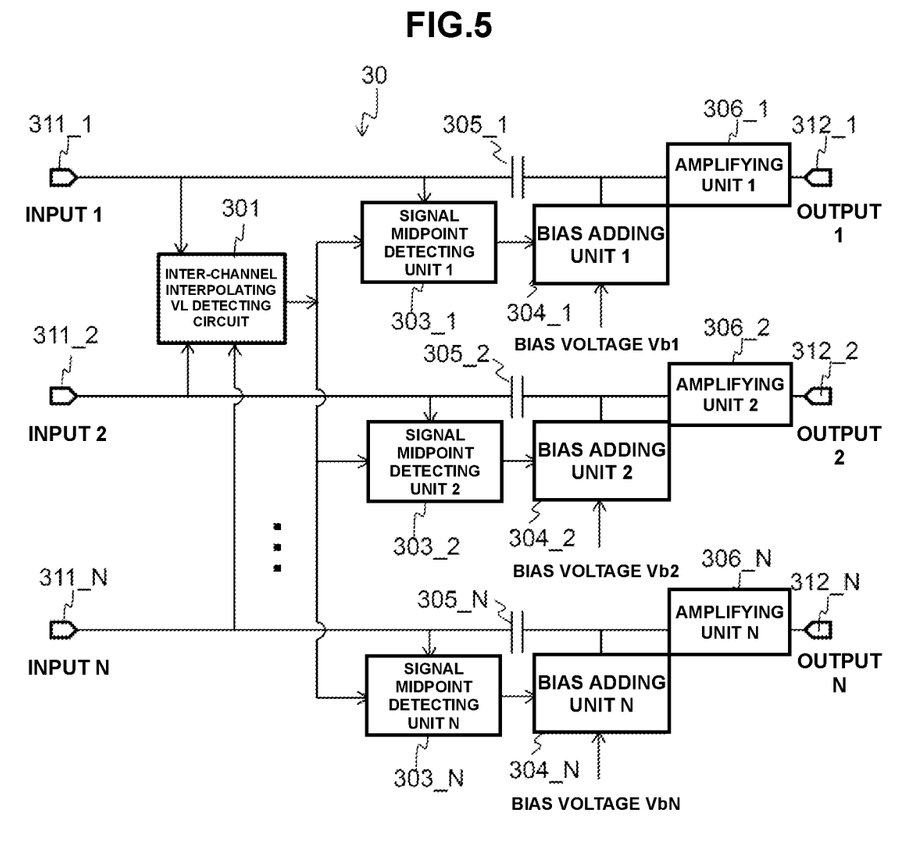
FIG. 5 shows a block diagram illustrating a configuration of an amplifier circuit according to a third embodiment of the present invention.
Figure 6:
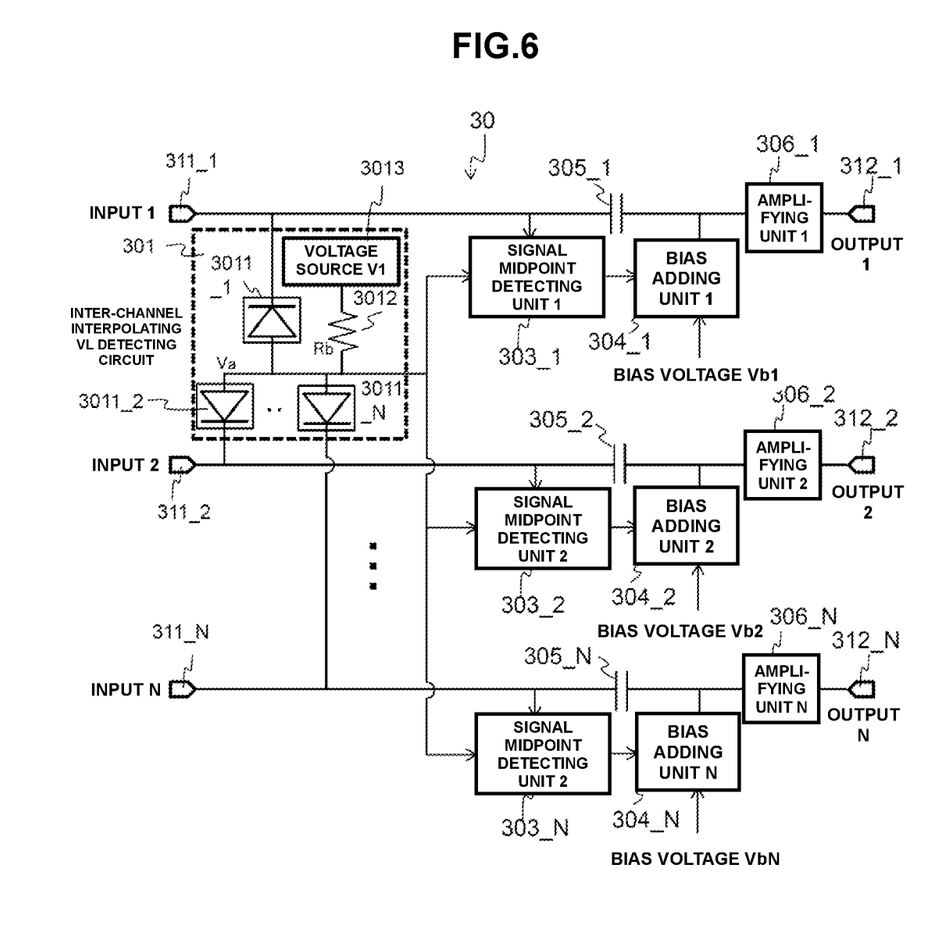
FIG. 6 shows a block diagram illustrating a configuration of the amplifier circuit according to the third embodiment of the present invention.

As illustrated in FIG. 5, the amplifier circuit 30 according to the present embodiment includes, for a plurality (N) of inputs and outputs, a single initial inter-channel interpolation voltage value (VL) detecting circuit 301, a plurality (N) of signal midpoint detecting units 303_1 to 303_N, a plurality (N) of bias adding units 304_1 to 304_N, a plurality (N) of isolating elements 305_1 to 305_N, and a plurality (N) of amplifying units 306_1 to 306_N. Configurations of the signal midpoint detecting units 303_1 to 303_N are the same as those of the first embodiment.

In the amplifier circuit 30, the signal midpoint detecting units 303_1 to 303_N and the bias adding units 304_1 to 304_N are connected in series, respectively, in parallel to the plurality of isolating elements 305_1 to 305_N, and the output of the inter-channel interpolating VL detecting circuit 301 connected to the plurality of input terminals 311_1 to 311_N is input (connected) to the plurality of signal midpoint detecting units 303_1 to 303_N. Moreover, the outputs of the bias adding units 304_1 to 304_N are connected to the amplifying units 306_1 to 306_N, respectively.

The inter-channel interpolating VL detecting circuit 301 connects to the input terminals 311_1 to 311_N to detect low voltage signals among signals in multiple channels. Specifically, as shown in FIG. 6, diode circuits 3011_1 to 3011_N are arranged between each input terminal 311_1 to 311_N and the input of each signal midpoint detecting unit 303_1 to 303_N, and a resistor (Rb) 3012 is connected to inputs of the signal midpoint detecting units 303_1 to 303_N. Here, it is assumed that the diode circuits 3011_1 to 3011_N are ideal diode circuits with a forward threshold voltage of 0 V. In addition, the diode circuits 3011_1 to 3011_N are connected such that the direction from the input of each signal midpoint detecting units 303_1 to 303_N to each input terminal 311_1 to 311_N is in the forward direction.

Operation of the Amplifier Circuit

First, the operation of the inter-channel interpolating VL detecting circuit 301 will be described. The voltage V1 of the voltage source is preset to be VL<V1<VH, between the low voltage VL and the high voltage VH of the input signal.

When a voltage VL is input to one of the input terminals 311_1 to 311_N (e.g., input terminal 311_1) as the initial voltage value, the diode circuit (e.g., 3011_1) is applied a voltage in the forward direction and switched to ON due to V1>VL. As a result, the input voltage Va of the signal midpoint detecting units 303_1 to 303_N becomes equal to VL. Here, the diode circuit with an input voltage of VH is in the OFF state, and therefore does not affect Va.

Here, the CR time constant is formed by Rb 3012 and a parasitic capacitance such as that of diodes arranged in the input of the signal midpoint detecting units 303_1 to 303_N. Meanwhile, Va changes to V1 according to the CR time constant from the time when the input terminals 311_1 to 311_N are all VH. The result is Va=V1 after a predetermined period in accordance with the CR time constant. Therefore, if the state where all input terminals 311_1 to 311_N are VH does not continue for a predetermined period or longer, Va does not change from VL. In other words, Va maintains the VL state in most of the time.

Suppose Va becomes V1, the signals vary between V1 and VH, and therefore the signal varying amount (amplitude) decreases as compared to the case where the signals vary between VL and VH when Va=VL. Consequently, there are disadvantages such as difficulty in detecting signals.

The probability of the above-described change in Va from VL will be described now.

The probability of Va being changed is calculated as follows by determining the CR time constant such that Va changes when the state where the input terminals 311_1 to 311_N are all VH continues consecutively in 10 bits.

Assuming that the bit rate is 10 Gbps, the probability that VH continues in 10 bits is $1/2^{10}$. If N=1, $2^{10}/10$ Gbps=102.4 nanoseconds, and therefore Va deviates once every 102.4 nanoseconds. If N=8, the probability that VH continues in 10 bits in all channels is $1/2^{80}$ and $2^{80}/10$ Gbps=$1.21 \times 10^{14}$ seconds=$3.8 \times 10^6$ years. As a result, Va changes only once every $3.8 \times 10^6$ years. In addition, the higher the number of channels, the lower the probability that Va changes.

Thus, the probability that Va changes from VL is very low, and therefore such a change in Va from VL rarely happens.

As described above, when a voltage VL is input to the inter-channel interpolating VL detecting circuit 301 as the initial voltage value, the input voltage Va of the signal midpoint detecting units 303_1 to 303_N is maintained at the initial voltage value VL.

The operation of the amplifier circuit 30 will be described now.

As described above, since the input Va of the signal midpoint detecting units 303_1 to 303_N is maintained at the low voltage VL, which is the initial voltage value, the output from the signal midpoint detecting units 303_1 to 303_N toward the bias adding units 304_1 to 304_N is also maintained at the low voltage VL.

Accordingly, when a voltage VL is input to one of the input terminals 311_1 to 311_N, the low voltage VL is output to the bias adding units 304_1 to 304_N continuously.

As a result, as in the first and second embodiments, each midpoint voltage calculating unit of the signal midpoint detecting units 303_1 to 303_N outputs the difference between the output of the low pass filter and the output (initial voltage value VL) of the inter-channel interpolating VL detecting circuit 301. This difference is input to the bias adding units 304_1 to 304_N, where the baseband signals to be input to the amplifying units 306_1 to 306_N are biased, and therefore the waveform distortion of the baseband signals is reduced.

In this manner, the amplifier circuit 30 according to the present embodiment can bias the baseband signals supplied from a plurality of preceding stage amplifiers with a bias voltage, to which the midpoint voltage of the baseband signals is added, and therefore baseband signals with reduced distortion can be input to the plurality of amplifying units 306_1 to 306_N, respectively.

Accordingly, the amplifying units 306_1 to 306_N amplify the baseband signals with reduced distortion, and therefore the baseband signals can be amplified accurately.

Thus, in accordance with the amplifier circuit according to the present embodiment, a preceding stage amplifier and a later-stage amplifier can be connected by AC coupling in order to remove the offset voltage of the preceding stage amplifier, and therefore the baseband signals containing DC components can be amplified accurately.

In addition, in the amplifier circuit according to the second embodiment, VL is extracted in one input/output circuit, and the midpoint voltage is detected by considering this VL as the minimum voltage value in N input signals. However, since this VL is not the lowest voltage in the N input signals, an accurate midpoint voltage in the N input signals is not detected. In the amplifier circuit according to present embodiment, a more accurate midpoint voltage in the N input signals can be detected by extracting the minimum voltage in the N input signals.

In addition, in the amplifier circuit according to the second embodiment, when a signal is input to another input terminal before a signal is input to one input terminal, the waveform distortion of the baseband signals cannot be reduced. Meanwhile, in accordance with the amplifier circuit according to the present embodiment, since a low voltage VL is detected in 1 to N input signals, it is possible to reduce the waveform distortion of the baseband signals regardless of which input terminal among the 1 to N input terminals the signal is input.

Fourth Embodiment

Next, the amplifier circuit according to the fourth embodiment of the present invention will be described with reference to FIGS. 7 to 8.

Configuration of the Amplifier Circuit

Figure 7:
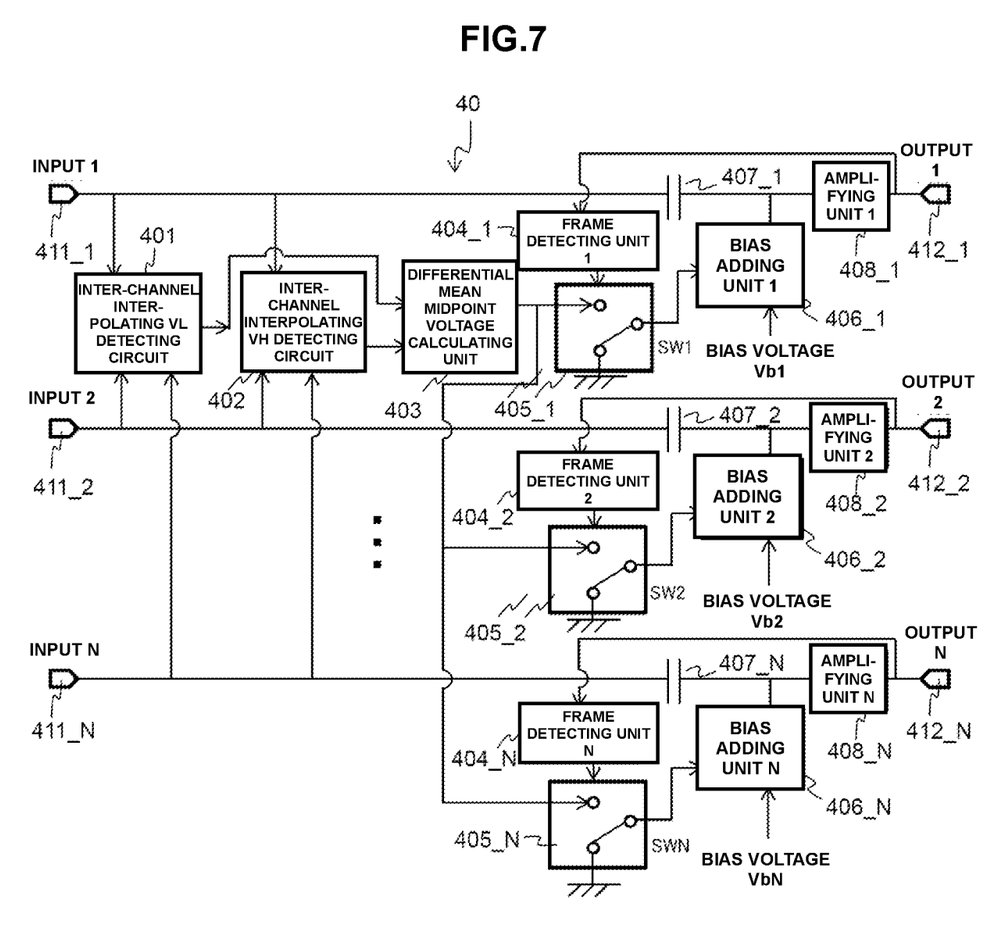
FIG. 7 shows a block diagram illustrating a configuration of an amplifier circuit according to a fourth embodiment of the present invention.
Figure 8:
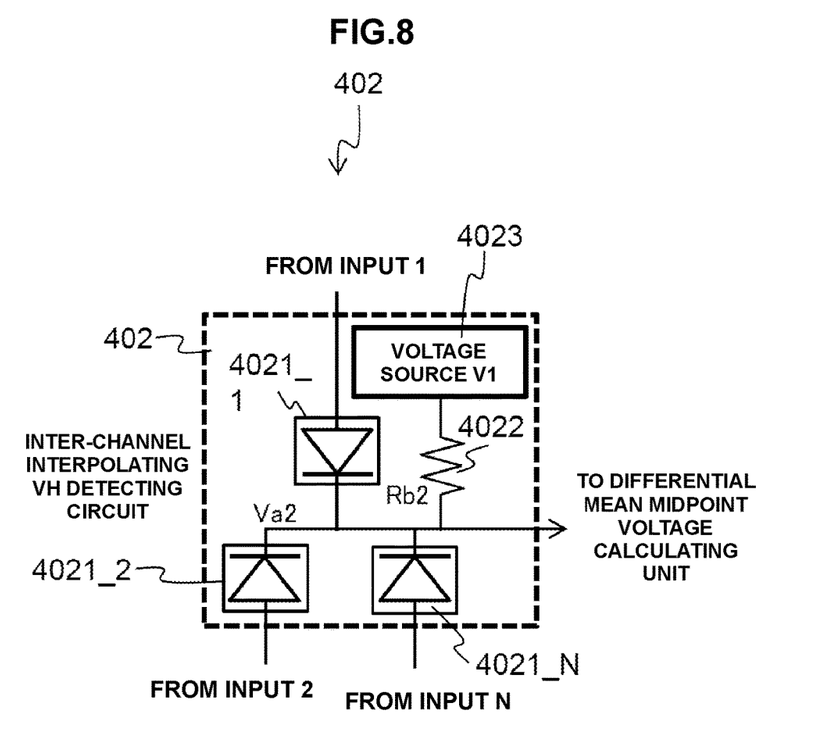
FIG. 8 shows a diagram illustrating an example of a configuration of an inter-channel interpolating VH detecting circuit in the amplifier circuit according to the fourth embodiment of the present invention.

As shown in FIG. 7, the amplifier circuit 40 according to the present embodiment includes, for a plurality (N) of inputs and outputs, a single inter-channel interpolating VL detecting circuit 401, a single inter-channel interpolating VH detecting circuit 402, a single differential mean midpoint voltage calculating unit 403, a plurality (N) of frame detecting circuits 404_1 to 404_N, a plurality (N) of switching devices (SW) 405_405_N, a plurality (N) of bias adding units 406_1 to 406_N, a plurality (N) of isolating elements 407_1 to 407_N, and a plurality (N) of amplifying units 408_1 to 408_N.

In the connection circuit 40, the frame detecting circuits 404_1 to 404_N, the plurality (N) of switching devices (SW) 405_1 to 405_N, and the plurality (N) of bias adding units 406_1 to 406_N are connected in series, in parallel to the plurality (N) of isolator elements 407_1 to 407_N, respectively, connected between the plurality (N) of input terminals 4011_1 to 411_N and the plurality (N) of amplifier units 408_1 to 408_N, and the outputs of the bias adding units 406_1 to 406_N are connected to the plurality (N) of amplifier units 408_1 to 408_N, respectively.

In addition, the inter-channel interpolating VL detecting circuit 401 and the inter-channel interpolating VH detecting circuit 402, which are connected to a plurality of input terminals 411_1 to 411_N, are connected to the differential mean midpoint voltage calculating unit 403, and the differential mean midpoint voltage calculating unit 403 is connected to a plurality (N) of switching devices 405_1 to 405_N.

The inter-channel interpolating VL detecting circuit 401 has a configuration similar to that of the third embodiment and includes diode circuits between the corresponding input terminals 411_1 to 411_N and the input of the differential mean midpoint voltage calculating unit 403, respectively, and a resistor (Rb) connected to the voltage source is connected to the input of the differential mean midpoint voltage calculating unit 403.

The inter-channel interpolating VH detecting circuit 402 is connected to the input terminals 411_1 to 411_N in parallel to the inter-channel interpolating VL detecting circuit 401 to detect high voltage signals in signals of multiple channels. Specifically, as shown in FIG. 8, the inter-channel interpolating VH detecting circuit 402 includes diode circuits 4021_1 to 4021_N between each input terminals 411_1 to 411_N and the input of the differential mean midpoint voltage calculating unit 403, and a resistor (Rb) 4022 connected to the voltage source (V1) 4023 is connected to the input of the differential mean midpoint voltage calculating unit 403. Here, it is assumed that the diode circuits 4021_1 to 4021_N are ideal diode circuits with a forward threshold voltage of 0 V. In addition, the diode circuits 4021_1 to 4021_N are connected such that the direction of input from each input terminals 411_1 to 411_N to the differential mean midpoint voltage calculating unit 403 is in the forward direction.

Operation of the Amplifier Circuit

First, the operation of the inter-channel interpolating VH detecting circuit 402 will be described. The voltage V1 of the voltage source is preset to be VL<V1<VH, between the low voltage VL and the high voltage VH of the input signal.

When a voltage VH is input to one input terminal (e.g., input terminal 411_1) among the input terminals 411_1 to 411_N, the diode circuit (e.g., 4021_1) is applied a voltage in the forward direction and is switched to ON because V1<VH. As a result, the input voltage Va2 of the differential mean midpoint voltage calculating unit 403 becomes equal to VH. Here, the diode circuit with an input voltage of VL is in the OFF state, and therefore VL does not affect Va2. Thus, if there is an input having a voltage of VH among the inputs 1-N, Va2 becomes VH.

Here, the CR time constant is formed by the resistor (Rb2) 4022 and a parasitic capacitance such as that of diodes arranged at the input of the differential mean midpoint voltage calculating unit 403. Accordingly, Va2 changes to V1 according to the CR time constant from the time when the input terminals 411_1 to 411_N are all VL. The result is Va2=V1 after a predetermined time elapsed in accordance with the CR time constant. Thus, Va2 does not change from VH unless a state where the input terminals 411_1 to 411_N are all VL continues for a predetermined period or longer. In other words, Va2 maintains a state of VH almost all the time.

Suppose Va2 becomes V1, the signals vary between V1 and VH as compared to a case where the signals vary between VL and VH when Va2=VH, and therefore the signal varying amount (amplitude) is reduced. As a result, there are disadvantages such as difficulty in detecting signals.

In addition, the probability that Va2 changes from VH is calculated in the same way as the probability that Va changes from VL in the third embodiment. As a result, the probability that all the input terminals 411_1 to 411_N are VL is extremely low except when data is not input to any of the transmission circuits, and the higher the number of channels, the lower the probability.

Therefore, the probability that Va2 changes from VH is very low, and therefore the change in Va2 from VH rarely happens.

As described above, when a voltage VH is input to the inter-channel interpolating VH detecting circuit 402, the input voltage Va2 of the differential mean midpoint voltage calculating unit 403 is maintained at VH.

The operation of the amplifier circuit 40 will be described now.

The inter-channel interpolating VL detecting circuit 401 has a configuration similar to that of the third embodiment, and detects a low voltage signal in signals of multiple channels.

The inter-channel interpolating VH detecting circuit 402 detects a high voltage signal in signals in multiple channels, as described above.

The differential mean midpoint voltage calculating unit 403 calculates the midpoint voltage between VL and VH from the output voltage VL of the inter-channel interpolating VL detecting circuit 401 and the output voltage VH of the inter-channel interpolating VH detecting circuit 402 to output the midpoint voltage to the switching devices (SW) 405_1 to 405_N.

For example, the differential mean midpoint voltage computation unit 403 is configured by connecting a voltage divider circuit to a later stage in the differential circuit. The differential circuit outputs the differential voltage between VL and VH, and the voltage divider circuit divides the voltage such that the differential voltage is ½. As a result, the midpoint voltage between VL and VH is calculated.

As in the first embodiment, each of the frame detecting circuits 404_1 to 404_N reads that the data signals amplified by the amplifying units 408_1 to 408_N change, to output the frame detection signal at a high voltage VH. Once the frame detection signal is output at the high voltage VH, the frame detection signals are output to the switching devices (SW) 405_1 to 405_N, continuously.

The switching devices (SW) 405_1 to 405_N are switched ON when the frame detection signal is input at VH, and output the output voltage (midpoint voltage) of the differential mean midpoint voltage calculating unit 403 to the bias adding units 406_1 to 406_N.

As in the first embodiment, the bias adding units 406_1 to 406_N output the sum of the bias voltages Vb1 to VbN of the transmission circuit and the outputs of the switching devices (SW) 405_1 to 405_N.

Accordingly, when data signals are input to each input terminal, a midpoint voltage is added to the bias voltage at each bias adding unit 406_1 to 406_N. As a result, the baseband signals input from each input terminal are biased with Vb1 to VbN before the data is input and biased with Vb1 to (VbN+midpoint voltage) after the data is input so as to be output to the amplifying units 408_1 to 408_N.

As a result, as in the first to third embodiments, the baseband signals input to the amplifying units 408_1 to 408_N are biased by the bias adding units 406_1 to 406_N, and therefore the waveform distortion of the baseband signals can be reduced.

In this manner, the amplifier circuit 40 according to the present embodiment can bias the baseband signals supplied from a plurality of preceding stage amplifiers with a bias voltage, to which the midpoint voltage of the baseband signals is added, and therefore baseband signals with reduced distortion can be input to the plurality of amplifying units 408_1 to 408_N, respectively.

Accordingly, the amplifying units 408_1 to 408_N amplify the baseband signals with reduced distortion, and therefore the baseband signals can be amplified accurately.

Thus, in accordance with the amplifier circuit according to the present embodiment, a preceding stage amplifier and a later-stage amplifier can be connected by AC coupling in order to remove the offset voltage of the preceding stage amplifier, and therefore the baseband signals containing DC components can be amplified accurately.

In the amplifier circuit according to the present embodiment, by extracting a high voltage in addition to a low voltage in N input signals, a more accurate midpoint voltage can be detected in the N input signals as compared to the amplifier circuit according to the third embodiment.

Furthermore, in accordance with the amplifier circuit according to the present embodiment, since a low voltage VL and a high voltage VH are detected in 1 to N input signals as in the amplifier circuit according to the third embodiment, the waveform distortion of the baseband signals can be reduced regardless of which input terminal among the 1 to N input terminals the signal is input.

In the embodiments of the present invention, examples wherein the output of the amplifier is connected to the input of the frame detecting circuit have been described but the present invention is not limited thereto. The input terminal may be connected to the input of the frame detecting circuit. However, connecting the output of the amplifier to the input of the frame detecting circuit allows higher detection sensitivity because the frame detecting circuit detects the change in the amplified signal.

In the embodiments of the present invention, examples of the structure, dimensions, materials, and the like are shown for the components in the configuration of the amplifier circuit, the manufacturing method, and the like but the present invention is not limited thereto. Having the functions of the amplifier circuit and having the advantageous effects are sufficient to be within the scope of the present invention.

INDUSTRIAL APPLICABILITY

Embodiments of the present invention relate to an amplifier circuit for amplifying baseband signals and can be applied to communication transmission systems.

REFERENCE SIGNS LIST 10 amplifier circuit
101 frame detecting circuit
102 initial voltage value detecting circuit
1021 signal delaying circuit
1022 sample-and-hold circuit
103 signal midpoint detecting unit
1031 low pass filter
1032 midpoint voltage calculating unit
104 bias adding unit
105 isolating element
106 amplifying unit
111 input terminal
112 output terminal

The invention claimed is:

1. An amplifier circuit, comprising:
an isolating element connected to an input terminal;
an amplifier connected between the isolating element and an output terminal;
a signal midpoint detecting circuit connected in parallel to the isolating element;
a bias adding circuit connected in series with the signal midpoint detecting circuit; and
an initial voltage value detecting circuit connected to a frame detecting circuit;
wherein the initial voltage value detecting circuit is configured to hold an initial voltage value of one of a plurality of baseband signals and output the initial voltage value to the signal midpoint detecting circuit, the plurality of baseband signals being input to the amplifier circuit from a preceding amplifier circuit in a preceding stage;
wherein the signal midpoint detecting circuit is configured to detect a midpoint voltage from the plurality of baseband signals and the initial voltage value, and output the midpoint voltage to the bias adding circuit;
wherein the bias adding circuit is configured to add the midpoint voltage to a bias voltage for biasing the plurality of baseband signals; and
wherein the amplifier is configured to amplify the plurality of baseband signals.

2. The amplifier circuit according to claim 1, wherein an output of the amplifier is input to the frame detecting circuit.

3. The amplifier circuit according to claim 1, wherein:
the initial voltage value detecting circuit comprises a signal delaying circuit connected to the input terminal, and a sample-and-hold circuit connected to the signal delaying circuit;
the signal midpoint detecting circuit comprises a low pass filter connected to the input terminal, and a midpoint voltage calculating circuit connected to the low pass filter;
the sample-and-hold circuit is configured to hold an initial voltage value of the plurality of baseband signals input from the signal delaying circuit in accordance with a signal from the frame detecting circuit and output the initial voltage value to the midpoint voltage calculating circuit; and the midpoint voltage calculating circuit is configured to output a difference between an output of the low pass filter and an output of the sample-and-hold circuit to the bias adding circuit.

4. The amplifier circuit according to claim 1, wherein:
the amplifier circuit comprises a plurality of isolating elements, a plurality of signal midpoint detecting circuits, a plurality of bias adding circuits, and a plurality of amplifiers;
each of the plurality of signal midpoint detecting circuits is connected to a corresponding one of the plurality of isolating elements in parallel thereto;
the initial voltage value detecting circuit is configured to output to a corresponding one of the plurality of signal midpoint detecting circuits; and
each of the plurality of signal midpoint detecting circuits is configured to output to a corresponding one of the plurality of bias adding circuits.

5. An amplifier circuit, comprising:
a plurality of isolating elements each connected to a corresponding one of a plurality of input terminals;
a plurality of amplifiers each connected between a corresponding one of the plurality of isolating elements and a corresponding one of a plurality of output terminals;
a plurality of signal midpoint detecting circuits each connected in parallel to a corresponding one of the plurality of isolating elements;
a plurality of bias adding circuits each connected in series with a corresponding one of the plurality of signal midpoint detecting circuits; and
an inter-channel interpolating low voltage (VL) detecting circuit;
wherein the inter-channel interpolating VL detecting circuit is configured to detect a low voltage signal among a plurality of baseband signals and outputs the low voltage signal to the corresponding one of the plurality of signal midpoint detecting circuits, wherein the plurality of baseband signals is input from a plurality of preceding amplifier circuits in a preceding stage of the amplifier circuit;
wherein the plurality of signal midpoint detecting circuits is configured to detect a midpoint voltage from the plurality of baseband signals and the low voltage signal and outputs the midpoint voltage to a corresponding one of the plurality of bias circuits;
wherein the plurality of bias adding circuits is configured to add the midpoint voltage to a bias voltage for biasing the plurality of baseband signals; and
wherein the plurality of amplifiers is configured to amplify the plurality of the baseband signals.

6. The amplifier circuit according to claim 5, wherein:
the inter-channel interpolating VL detecting circuit comprises a plurality of diode circuits, a resistor, and a voltage source;
each of the plurality of baseband signals is input to a first end of each of the plurality of diode circuits;
the voltage source is connected to a second end of each of the plurality of diode circuits via the resistor; and
the diode circuit is connected such that a direction from the second end to the first end is in a forward direction.

7. A connection circuit connected to preceding stages in a plurality of transmitter circuits and to which a plurality of baseband signals are input, the connection circuit comprising:
a plurality of isolating elements each connected between a corresponding one of a plurality of input terminals and a corresponding one of a plurality of output terminals;
a plurality of amplifiers each connected between a corresponding one of the plurality of isolating elements and the corresponding one of the plurality of output terminals;
a plurality of frame detecting circuits each connected in parallel to the corresponding one of the plurality of isolating elements;
a plurality of switching devices each connected in series with a corresponding one of the plurality of frame detecting circuits;
a plurality of bias adding circuits each connected in series with a corresponding one of the plurality of switching devices; and
a differential mean midpoint voltage calculating circuit to which an output of an inter-channel interpolating low voltage (VL) detecting circuit and an output of an inter-channel interpolating high voltage (VH) detecting circuit are input;
wherein the inter-channel interpolating VL detecting circuit is configured to detect an input of a low voltage signal in the plurality of baseband signals and outputs the low voltage signal to the differential mean midpoint voltage calculating circuit;
wherein the inter-channel interpolating VH detecting circuit is configured to detect an input of a high voltage signal in the plurality of baseband signals and outputs the high voltage signal to the differential mean midpoint voltage calculating circuit;
wherein the differential mean midpoint voltage calculating circuit is configured to output a midpoint voltage to the plurality of switching devices from an output of the inter-channel interpolating VL detecting circuit and an output of the inter-channel interpolating VH detecting circuit; wherein each of the plurality of switching devices is configured to output the midpoint voltage to a corresponding one of the plurality of bias adding circuits in accordance with an input from the corresponding one of the plurality of the frame detecting circuits; wherein each of the bias adding circuits is configured to add the midpoint voltage to a corresponding bias voltage for biasing a corresponding one of the plurality of baseband signals; and wherein each of the plurality of amplifiers is configured to amplify the corresponding one of the plurality of baseband signals.

8. The connection circuit according to claim 7, wherein:
the inter-channel interpolating VH detecting circuit comprises a plurality of diode circuits, a resistor, and a voltage source;
each of the plurality of baseband signals is input to a first end of each of the plurality of diode circuits;
the voltage source is connected to a second end of each of the plurality of diode circuits via the resistor; and
the diode circuit is connected such that a direction from the first end to the second end is in a forward direction.

* * * * *